United States Patent
Yoon

(10) Patent No.: US 7,692,982 B2
(45) Date of Patent: Apr. 6, 2010

(54) SEMICONDUCTOR MEMORY APPARATUS WITH WRITE TRAINING FUNCTION

(75) Inventor: Sang-Sic Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 139 days.

(21) Appl. No.: 11/878,572

(22) Filed: Jul. 25, 2007

(65) Prior Publication Data

US 2008/0219064 A1   Sep. 11, 2008

(30) Foreign Application Priority Data

Mar. 9, 2007   (KR) ............... 10-2007-0023486

(51) Int. Cl.
*G11C 7/00* (2006.01)
(52) U.S. Cl. .................... 365/191; 365/189.16
(58) Field of Classification Search ............ 365/189.16, 365/191
See application file for complete search history.

(56) References Cited

U.S. PATENT DOCUMENTS

| | | | |
|---|---|---|---|
| 5,155,821 A * | 10/1992 | Sone et al. ............ 714/35 |
| 7,411,862 B2 * | 8/2008 | Hein et al. ............ 365/233.1 |
| 2005/0240744 A1 | 10/2005 | Shaikh et al. |
| 2008/0065967 A1 * | 3/2008 | Talbot .................. 714/781 |

FOREIGN PATENT DOCUMENTS

| | | |
|---|---|---|
| JP | 09-167485 | 6/1997 |
| KR | 1020050001152 | 1/2005 |

\* cited by examiner

*Primary Examiner*—Hoai V Ho
(74) *Attorney, Agent, or Firm*—Venable LLP; Jeffri A. Kaminski

(57) ABSTRACT

A semiconductor memory apparatus having a write training function includes a storage unit that stores write data or read data output from a memory cell block and outputs data according to an output control signal, and a control unit that controls the output control signal to be generated at different timings according to whether or not a write training signal is activated.

20 Claims, 5 Drawing Sheets

[FIG. 1A]
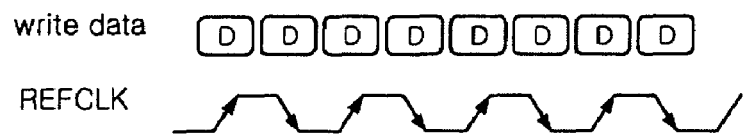
[FIG. 1B]
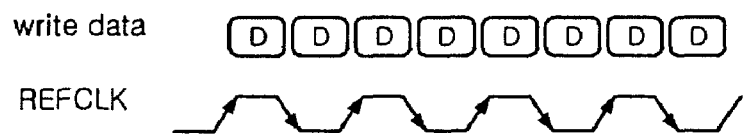
[FIG. 1C]
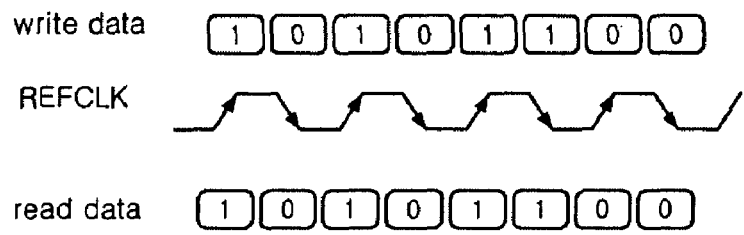
[FIG. 1D]
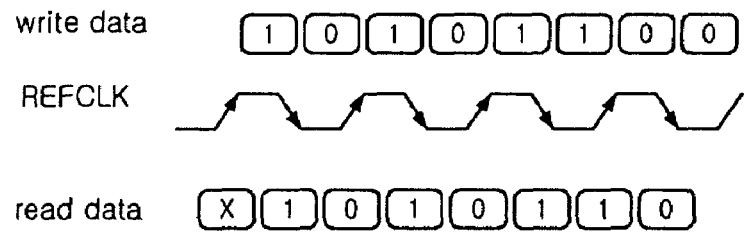

SEMICONDUCTOR MEMORY APPARATUS WITH WRITE TRAINING FUNCTION

CROSS-REFERENCE TO RELATED PATENT APPLICATION

This application claims the benefit of Korean Patent Application No. 10-2007-0023486, filed on Mar. 9, 2007, in the Korean Intellectual Property Office, the disclosure of which is incorporated herein in its entirety by reference.

BACKGROUND OF THE INVENTION

1. Technical Field

Embodiments of the invention relate to semiconductor circuit technology, and in particular, a semiconductor memory apparatus having a write training function.

2. Related Art

In a graphic processing unit (hereinafter, referred to as "GPU") of a chipset that requires a high-speed data processing, a write training operation is performed to secure stability of the data processing before general data processing is performed.

The write training operation will be described with reference to FIGS. 1A to 1D.

During a normal write operation, as shown in FIG. 1A, data that is center-aligned with respect to a reference clock REF-CLK is input.

During a write training operation, as shown in FIG. 1B, the reference clock REFCLK is shifted, such that data is aligned with an edge of the reference clock REFCLK.

However, in some cases during the write training operation, data may not be aligned with the edge of the reference clock REFCLK according to strobe timing.

The gist of the write training operation is as follows. When data is faster than the reference clock REFCLK as shown in FIG. 1C, or when data is slower than the reference clock REFCLK as shown in FIG. 1D, the reference clock REFCLK is advanced or delayed such that data is aligned with the edge the reference clock REFCLK as shown in FIG. 1B. Then, the reference clock REFCLK is shifted to the original state again, thereby exhibiting an optimum setup/hold characteristic during the normal operation.

The write training operation is performed under the control of a chipset that uses a semiconductor memory apparatus. The semiconductor memory apparatus needs to support a function of storing data output from the chipset and outputting the stored data to the chipset.

However, the semiconductor memory apparatus according to the related art does not have hardware and software functions for supporting the write training function. Even if a software function is provided to support the write training function, when temporary data for the write training operation is written in a memory cell, which is basically provided in the semiconductor memory apparatus itself, original data may be changed.

SUMMARY

Embodiments of the invention may provide a semiconductor memory apparatus that may support a stable write training function.

According to an embodiment of the invention, a semiconductor memory apparatus having a write training function may include a storage unit that may store write data or read data output from a memory cell block and output the stored data according to an output control signal, and a control unit that may control the output control signal to be generated at different timings according to a write training signal.

According to another embodiment of the invention, a semiconductor memory apparatus having a write training function may include a data line that may be commonly used for data write and read operations, a storage unit that may store write data input from the outside through the data line or read data output from the memory cell block through the data line and output the stored data according to an output control signal, and a control unit that may control the output control signal to be generated at different timings according to whether or not a write training signal is activated.

According to still another embodiment of the invention, a semiconductor memory apparatus having a write training function may include a switching unit that may selectively output, in response to a write training signal, either write data input from the outside through a first data line or read data output from a memory cell block through a second data line, a storage unit that may store data output from the switching unit and output the stored data according to an output control signal, and a control unit that may control the output control signal to be generated at different timings according to whether or not the write training signal is activated.

BRIEF DESCRIPTION OF THE DRAWINGS

FIGS. 1A to 1D are timing charts illustrating a write training method in a semiconductor memory apparatus;

DESCRIPTION OF EXEMPLARY EMBODIMENTS

Hereinafter, exemplary embodiments of a semiconductor memory apparatus having a write training function will be described with reference to the accompanying drawings.

Figure 2:
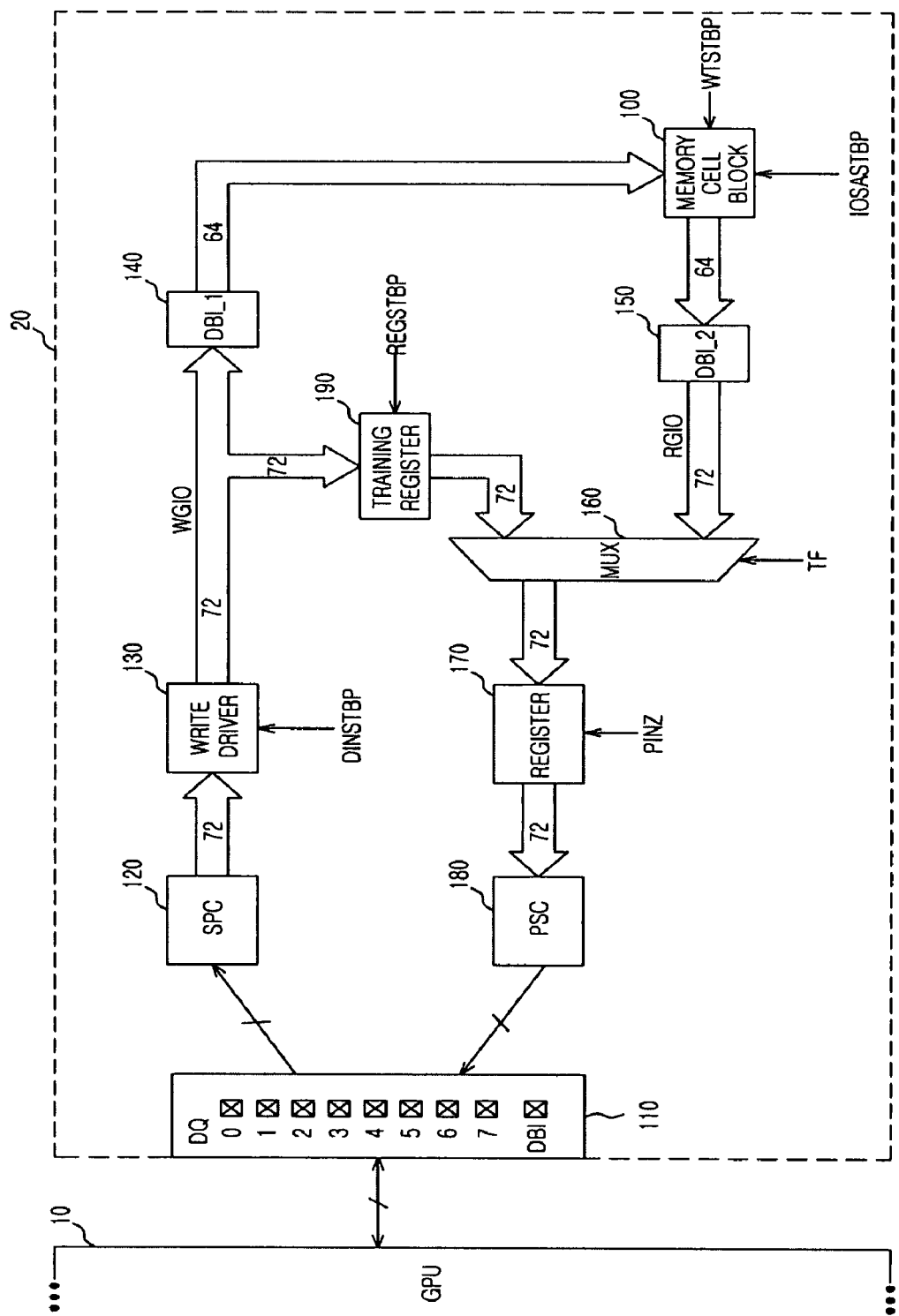
FIG. 2 is a block diagram of an exemplary semiconductor memory apparatus having a write training function according to an embodiment of the invention.

As shown in FIG. 2, an exemplary semiconductor memory apparatus 20 having a write training function according to an embodiment of the invention may include a memory cell block 100, a pad 110, a serial-to-parallel converter (hereinafter, referred to as "SPC") 120, a write driver 130, a first data bus inverter (hereinafter, referred to as "DBI_1") 140, a second data bus inverter (hereinafter, referred to as "DBI_2") 150, a multiplexer (hereinafter, referred to as "MUX") 160, a register 170, a parallel-to-serial converter (hereinafter, referred to as "PSC") 180, and a training register 190.

The memory cell block 100 may receive data, for example, from the outside of the semiconductor apparatus 20 and write data in a memory cell according to a write strobe signal WTSTBP, and output data written in the memory cell according to a read strobe signal IOSASTBP.

The pad 110 may have a different number of data input/output pins according to a difference in memory size or model. In FIG. 2, the exemplary pad 110 has eight data input/output pins DQ<0:7> and a DBI pin DBI.

The SPC 120 may convert data, for example, serial data input from a GPU 10 of a chipset, in which the semiconductor memory apparatus 20 is provided, through the pins of the pad 110 to parallel data, and output parallel data to the write driver 130.

The write driver 130 may latch parallel data output from the SPC 120 and output parallel data to a first DBI 140 in response to an input strobe signal DINSTBP through a writing global data line WGIO.

The training register 190 may store write training data, for example, data for a write training operation output from the GPU 10, and output write training data in response to a delay strobe signal REGSTBP. The delay strobe signal REGSTBP may be generated by delaying the input strobe signal DINSTBP for a predetermined time. The training register 190 should store data output from the GPU 10 in an original state and transmit the stored data to the GPU 10 again. The training register 190 may be configured to receive data through a data line in front of the DBI_1 140, that is, a data line that branches off from the writing global data line WGIO.

A DBI signal, for example, an 8-bit signal, may be included in data output from the write driver, for example 72-bit data. According to the 8-bit DBI signal included in the 72-bit data output from the write driver 130, the DBI_1 140 may invert, for example, 64-bit data excluding the 8-bit DBI signal or keep the data in its original state, and then transmit inverted data or original data to the memory cell block 100.

The DBI_2 150 may invert data output from the memory cell block 100, for example, 64-bit data, through the comparison with previous data, then adds, to the data, for example, the 64-bit data, a DBI signal, for example, an 8-bit DBI signal, which is generated according to the comparison result, and subsequently outputs the added data, for example, 72-bit data in total, through a reading global data line RGIO.

The MUX 160 may serve as a switching unit that selectively outputs either data output from the training register 190 or data output from the DBI_2 150 according to a write training signal TF.

The register 170 may output data output from the MUX 160 to the PSC 180 according to an output strobe signal PINZ, for example, in an FIFO (First in First Out) manner. The register 170 may be used to control data to be transmitted according to a prescribed latency when data output from the memory cell block 100 is output to the outside of the semiconductor memory apparatus. For example, if data that is set to be transmitted within 15 ns is transmitted from the memory cell block 100 to the register 170 within 8 ns, data should be additionally stored for 7 ns. In this case, the register 170 stores data for the remaining time. Therefore, the output strobe signal PINZ is generated by delaying the input strobe signal DINSTBP for 7 ns.

The PSC 180 may convert parallel data output from the register 170 to serial data and output serial data to the GPU 10 through the pad 110.

An example of operation of the above-described semiconductor memory apparatus having a write training function will now be described.

First, during a normal write operation, data output from the GPU 10 may be transmitted to the memory cell block 100 through the pad 110, the SPC 120, the write driver 130, and the DBI_1 140. Data transmitted to the memory cell block 100 may be written in the memory cell block 100 according to the write strobe signal WTSTBP that is generated on the basis of a write command. Data output from the write driver 130 may also be stored in the training register 190.

During a normal read operation, data may be output from the memory cell block 100 according to the read strobe signal IOSASTBP that is generated on the basis of a read command. Data output from the memory cell block 100 may be output to the GPU 10 through the DBI_2 150, the MUX 160, the register 170, the PSC 180, and the pad 110.

Meanwhile, during a write training operation, write training data output from the GPU 10 may be loaded on the writing global data line WGIO through the pad 110, the SPC 120, and the write driver 130. Data on the writing global data line WGIO may be stored in the training register 190, then output in response to a delay strobe signal REGSTBP, and subsequently may be output to the GPU 10 through the MUX 160, the register 170, the PSC 180, and the pad 110. Data on the writing global data line WGIO may be transmitted to the memory cell block 100 through the DBI_1 140, but the data may not be written in the memory cell because the write strobe signal WTSTBP is not generated. At this time, since the write training signal TF is activated, the MUX 160 selects and passes the output of the training register 190. During the normal operation, since the write training signal TF is inactivated, the MUX 160 selects and passes the output of the DBI_2 150.

The GPU 10 performs the write training operation by adjusting the phase of the reference clock REFCLK using data output from the semiconductor memory apparatus 20. As described above, the write training function may be supported by using an additional register.

Hereinafter, an exemplary semiconductor memory apparatus having a write training function according to another embodiment of the invention will be described with reference to the accompanying drawings.

Figure 3:
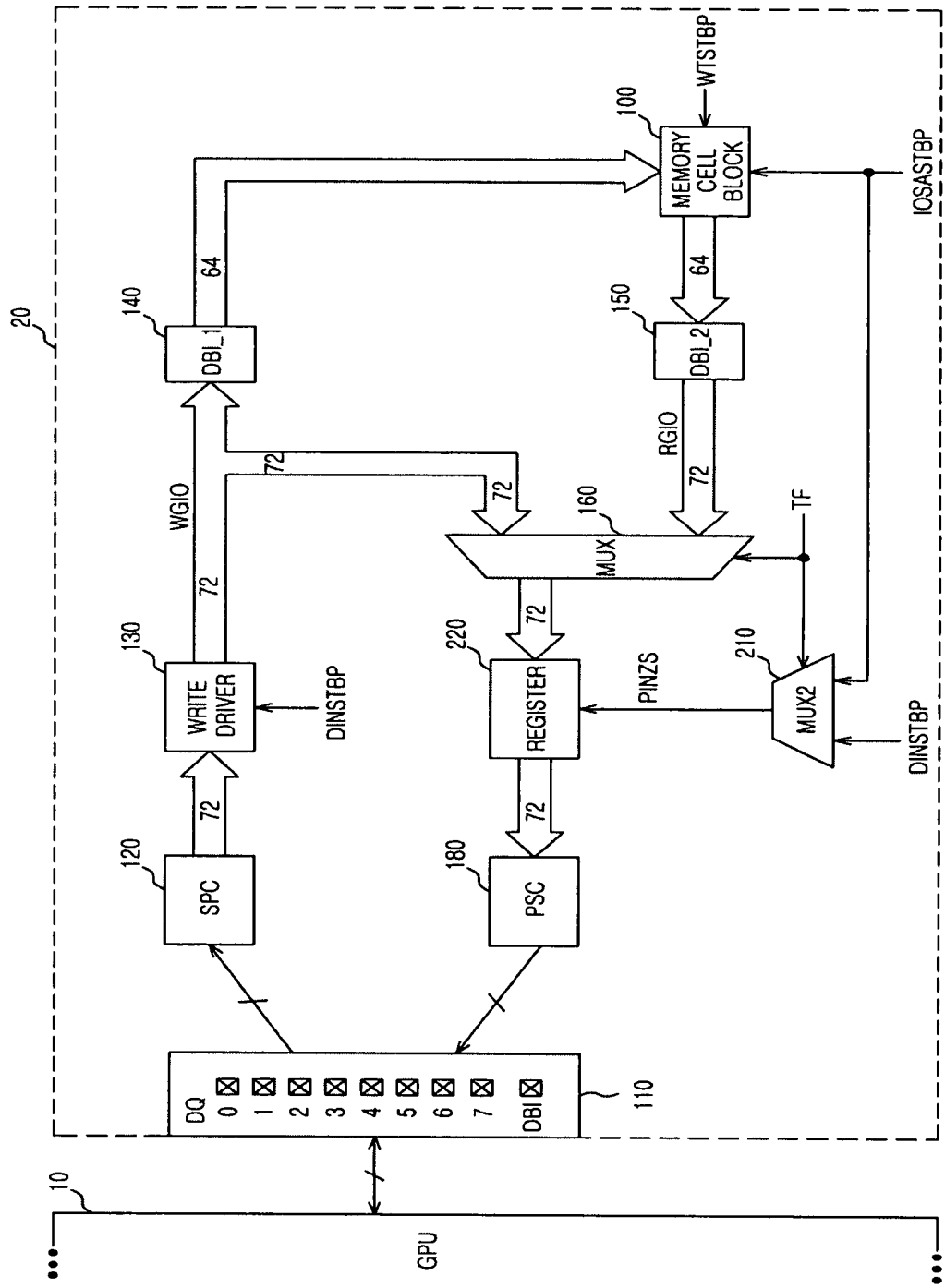
FIG. 3 is a block diagram an exemplary semiconductor memory apparatus having a write training function according to another embodiment of the invention.

Unlike the embodiment shown in FIG. 2, in a semiconductor memory apparatus having a write training function according to the embodiment shown in FIG. 3, an additional register may not be used, and a register that is basically provided in the semiconductor memory apparatus may be used for both the normal operation and the write training operation.

As shown in FIG. 3, the exemplary semiconductor memory apparatus 20 having a write training function according to this embodiment may include a memory cell block 100, a pad 110, an SPC 120, a write driver 130, a DBI_1 140, a DBI_2 150, a first multiplexer (hereinafter, referred to as "MUX") 160, a second multiplexer (hereinafter, referred to as "MUX2") 210, a register 220, and a PSC 180.

The memory cell block 100, the pad 110, the SPC 120, the write driver 130, the DBI_1 140, the DBI_2 150, the MUX 160, and the PSC 180 may be the same as those in FIG. 2. The same parts are represented by the same reference numerals, and the descriptions thereof will be omitted.

The register 220 may be used to control data to be transmitted according to a prescribed latency when data output from the memory cell block 100 is output to the outside of the semiconductor memory apparatus. The register 220 may store and output data output from the memory cell block 100, for example, in the FIFO manner during the normal operation, and also store and output data output from the GPU 10 during the write training operation. The register 220 may be, for example, a multiple FIFO type, and the depth of the FIFO may be determined according to an address access time (tAA) and a read latency (RL). For example, if the depth of the FIFO is 5 and the burst length (BL) is "8", 40-bit write training data can be processed to the maximum.

The MUX2 210 may serve as a control unit that may select either the input strobe signal DINSTBP or the read strobe signal IOSASTBP according to the write training signal TF, delay the selected signal for a predetermined time so as to generate an output strobe signal PINZS, and output the generated output strobe signal PINZS. The MUX2 210 may include at least one delay element that may delay the selected signal for a predetermined time.

The register 220 may have different data input paths during the normal operation and the write training operation and thus the data output timing may be different. Therefore, the MUX2 210 may adjust the output timing of the register 220 using the write training signal TF.

Figure 4:
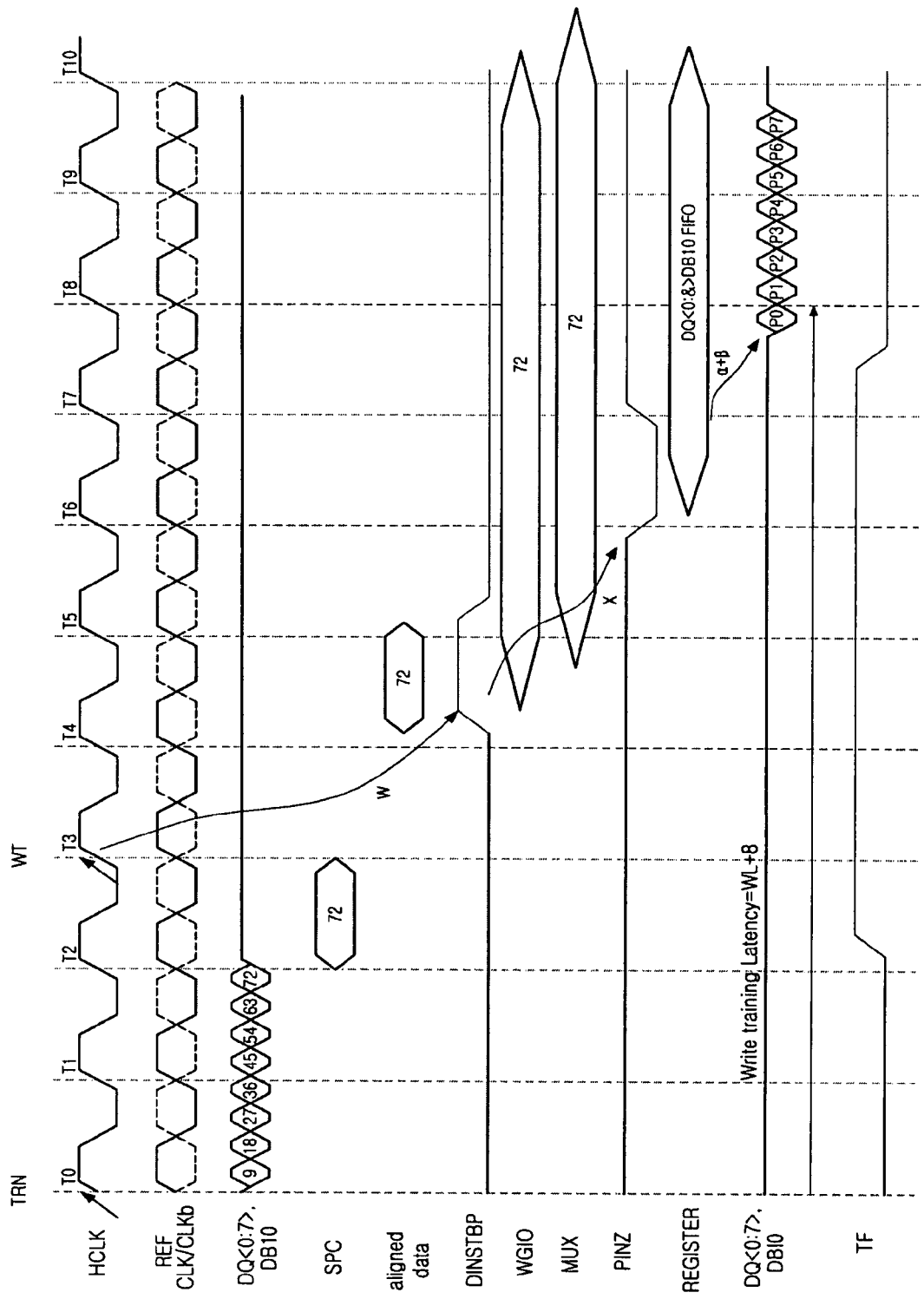
FIG. 4 is an exemplary timing chart of a write training operation according to an embodiment of the invention.

An example of the operation of the above-described semiconductor memory apparatus having a write training function will now be described with reference to FIG. 4.

First, during the normal write operation, data output from the GPU 10 may be transmitted to the memory cell block 100 through the pad 110, the SPC 120, the write driver 130, and the DBI_1 140. Data transmitted to the memory cell block 100 may be written in the memory cell block 100 according to the write strobe signal WTSTBP that is generated on the basis of the write command. Since the write training signal TF is inactivated, data output from the write driver 130 may not be directly transmitted to the register 220 through the MUX 160.

During the normal read operation, data may be output from the memory cell block 100 according to the read strobe signal IOSASTBP, which is generated on the basis of the read command. Data output from the memory cell block 100 may be stored in the register 220 through the DBI_2 150 and the MUX 160.

Since the write training signal TF is inactivated, the MUX2 210 may select the read strobe signal IOSASTBP and delay the read strobe signal IOSASTBP for a predetermined time so as to output the output strobe signal PINZS.

The register 220 may output the stored data, for example, in the FIFO manner in response to the output strobe signal PINZS.

Data output from the register 220 may be output to the GPU 10 through the PSC 180 and the pad 110.

During the write training operation, if the write training command TRN is generated, after a predetermined write latency elapses, write training data may be input through the pins of the pad 110, and then converted to parallel data by the SPC 120.

If the write command WT is generated after data is input, the input strobe signal DINSTBP may be generated after an internal delay time W elapses.

The write driver 130 may output data to the writing global data line WGIO in response to the input strobe signal DINSTBP.

Data on the writing global data line WGIO may be transmitted to the memory cell block 100 through the DBI_1 140, but the data may not be written in the memory cell block 100 because the write strobe signal WTSTBP is not generated.

Meanwhile, data on the writing global data line WGIO may be stored in the register 220 through the MUX 160. Since the read strobe signal IOSASTBP is not generated during the write training operation, data may not be output from the memory cell block 100. In this case, since the write training signal TF is activated, a path that connects the MUX 160 and the DBI_2 150 may be disconnected.

Since the write training signal TF is activated, the MUX2 210 may select the input strobe signal DINSTBP and delays the input strobe signal DINSTBP for a predetermined time so as to output the output strobe signal PINZS.

The register 220 may output the stored data, for example, in the FIFO manner in response to the output strobe signal PINZS.

Data output from the register 220 may be output to the GPU 10 through the PSC 180 and the pad 110.

The GPU 10 performs the write training operation by adjusting the phase of the reference clock REFCLK using data output from the semiconductor memory apparatus 20.

Hereinafter, a semiconductor memory apparatus having a write training function according to still another embodiment of the invention will be described with reference to the accompanying drawings.

The exemplary semiconductor memory apparatus having a write training function according to this embodiment may be applied to a case where a single global data line may be commonly used for both the data read and write operations, without separately using the writing global data line WGIO and the reading global data line RGIO. This embodiment may be the same as the embodiment shown in FIG. 3 in that an additional register may not be used, and a register that is basically provided in the semiconductor memory apparatus may be used for both the normal operation and the write training operation.

Figure 5:
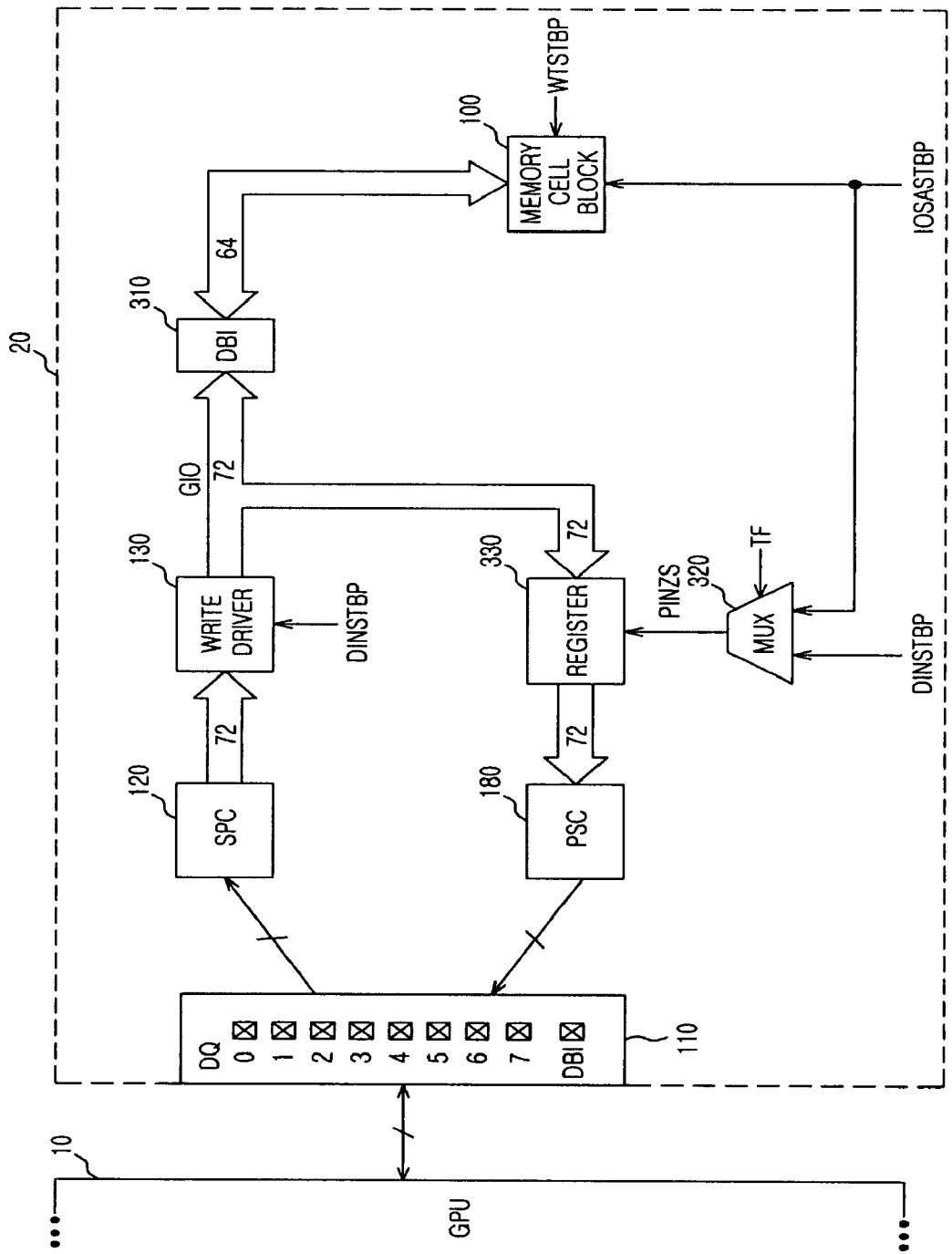
FIG. 5 is a block diagram of an exemplary semiconductor memory apparatus having a write training function according to still another embodiment of the invention.

As shown in FIG. 5, the exemplary semiconductor memory apparatus 20 having a write training function 20 according to this embodiment may include a memory cell block 100, a pad 110, an SPC 120, a write driver 130, a DBI 310, a MUX 320, a register 330, and a PSC 180.

The memory cell block 100, the pad 110, the SPC 120, the write driver 130, and the PSC 180 may be the same as those in FIG. 2. The same parts are represented by the same reference numerals, and thus the descriptions thereof will be omitted.

In the embodiment shown in FIG. 5, the global data line may be commonly used for both the read and write operations, that is, the same data path may be used for both the read and write operations. Accordingly, a single DBI 310 may be provided, and the MUX 160 shown in FIG. 3 may not need to be provided.

The register 330 may used to control data to be transmitted according to a prescribed latency when data output from the memory cell block 100 is output to the outside of the semiconductor memory apparatus. The register 330 may store and output data output from the memory cell block 100, for example, in the FIFO manner during the normal operation, and may also store and output data output from the GPU 10 during the write training operation.

The MUX 320 may serve as a control unit that may select either the input strobe signal DINSTBP or the read strobe signal IOSASTBP according to the write training signal TF, delay the selected signal for a predetermined time so as to generate the output strobe signal PINZS, and output the generated output strobe signal PINZS. The MUX 320 may include a delay element that delays the selected signal.

The register 330 may have different data input paths during the normal operation and the write training operation, and thus the data output timing may be different. Therefore, the MUX 320 may adjust the output timing of the register 330 using the write training signal TF.

An example of the operation of the above-described semiconductor memory apparatus having a write training function will now be described.

First, during the normal write operation, data output from the GPU 10 may be transmitted to the memory cell block 100 through the pad 110, the SPC 120, the write driver 130, and the DBI 310. Data transmitted to the memory cell block 100 may be written in the memory cell block 100 according to the write strobe signal WTSTBP, which is generated on the basis of the write command.

During the normal read operation, data output from the memory cell block 100 may be stored in the register 330 through the DBI 310 according to the read strobe signal IOSASTBP, which is generated on the basis of the read command.

Since the write training signal TF is inactivated, the MUX 320 may select the read strobe signal IOSASTBP, and delay the read strobe signal IOSASTBP for a predetermined time so as to output the output strobe signal PINZS.

The register 330 may output the stored data, for example, in the FIFO manner in response to the output strobe signal PINZS.

Data output from the register 330 may be output to the GPU 10 through the PSC 180 and the pad 110.

During the write training operation, write training pattern data output from the GPU 10 may be loaded on the global data line GIO through the pad 110, the SPC 120, and the write driver 130. Data on the global data line GIO may be transmitted to the memory cell block 100 through the DBI 310, but the data may not be written in the memory cell block 100 because the write strobe signal WTSTBP is not generated.

Meanwhile, data on the global data line GIO may be stored in the register 330. During the write training operation, since the read strobe signal IOSASTBP is not generated, data may not be output from the memory cell block 100.

Since the write training signal TF is activated, the MUX 320 may select the input strobe signal DINSTBP, and delay the input strobe signal DINSTBP for a predetermined time so as to output the output strobe signal PINZS.

The register 330 may output the stored data, for example, in the FIFO manner in response to the output strobe signal PINZS.

Data output from the register 330 may be output to the GPU 10 through the PSC 180 and the pad 110.

The GPU 10 performs the write training operation by adjusting the phase of the reference clock REFCLK using data output from the semiconductor memory apparatus 20.

It will be apparent to those skilled in the art that various modifications and changes may be made without departing from the scope and spirit of the invention. Therefore, it should be understood that the above embodiments are not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

In the semiconductor memory apparatus having a write training function, a register for a read operation that is provided in the semiconductor memory apparatus can be utilized, it may not be necessary to provide an additional register, and to increase an area. Therefore, an efficient, stable, and high-performance write training function can be supported. In addition, since write training is stably performed, a data processing performance between the semiconductor memory apparatus and a system using the same can be improved.

What is claimed is:

1. A semiconductor memory apparatus having a function of write training, the apparatus comprising:
   a storage unit configured to store write data or read data output from a memory cell block to obtain stored data and output the stored data according to an output control signal; and
   a control unit configured to control the output control signal to be generated at different timings according to whether or not a write training signal is activated.

2. The semiconductor memory apparatus of claim 1, wherein the storage unit comprises an FIFO (First In First Out) type register.

3. The semiconductor memory apparatus of claim 1, further comprising:
   a write driver configured to drive the write data.

4. The semiconductor memory apparatus of claim 3, wherein the control unit includes a multiplexer configured to select either a signal for determining a data output timing of the write driver or a signal for determining a data read timing of the memory cell block according to the write training signal to obtain a selected signal, and generate the output control signal using the selected signal.

5. A semiconductor memory apparatus having a function of write training, the apparatus comprising:
   a data line configured to be commonly used for data write and read operations;
   a storage unit configured to store write data input through the data line or read data output from a memory cell block through the data line to obtain stored data and output the stored data according to an output control signal; and
   a control unit configured to control the output control signal to be generated at different timings according to whether or not a write training signal is activated.

6. The semiconductor memory apparatus of claim 5, wherein the storage unit comprises an FIFO (First In First Out) type register.

7. The semiconductor memory apparatus of claim 5, further comprising:
   a write driver configured to drive the write data.

8. The semiconductor memory apparatus of claim 7, wherein the control unit includes a multiplexer configured to select either a signal for determining a data output timing of the write driver or a signal for determining a data read timing of the memory cell block according to the write training signal, and generate the output control signal using the selected signal.

9. A semiconductor memory apparatus having a write training function, the apparatus comprising:
   a memory cell block;
   a switching unit configured to selectively output, in response to a write training signal, either data input from outside of the semiconductor memory apparatus through a first path or data output from the memory cell block through a second path;
   a storage unit configured to store data output from the switching unit to obtain stored data and output the stored data in response to an output control signal; and
   a control unit configured to select either an input strobe signal for determining a data output timing of the write driver or a read strobe signal based on the write training signal so as to generate the output control signal.

10. The semiconductor memory apparatus of claim 9, wherein the first path includes:
    a write driver that drives data; and
    a first data line coupled between the write driver and the memory cell block.

11. The semiconductor memory apparatus of claim 9, wherein the second path includes a second data line coupled between the memory cell block and the switching unit.

12. The semiconductor memory apparatus of claim 10, wherein the read strobe signal comprises a signal indicating to read data written in the memory cell block.

13. The semiconductor memory apparatus of claim 10, wherein the control unit includes a multiplexer configured to select either the input strobe signal or the read strobe signal to obtain a selected signal, and delay the selected signal so as to generate the output control signal.

14. The semiconductor memory apparatus of claim 9, wherein the storage unit comprising an FIFO (First In First Out) type register.

15. A semiconductor memory apparatus having a write training function comprising:
   a switching unit configured to selectively output, in response to a write training signal, either write data input through a first data line or read data output from a memory cell block through a second data line;
   a storage unit configured to store data output from the switching unit to obtain stored data and output the stored data according to an output control signal; and
   a control unit configured to control the output control signal to be generated at different timings according to whether or not the write training signal is activated,
   wherein the switching further couples to and is controlled by the control unit.

16. The semiconductor memory apparatus of claim 15, wherein the first data line comprises a writing global data line.

17. The semiconductor memory apparatus of claim 15, wherein the second data line comprises a reading global data line.

18. The semiconductor memory apparatus of claim 15, further comprising:
   a write driver configured to drive data input from outside of the semiconductor apparatus and transmit the data to the first data line.

19. The semiconductor memory apparatus of claim 15, wherein the storage unit comprises an FIFO (First In First Out) type register.

20. The semiconductor memory apparatus of claim 18, wherein the control unit includes a multiplexer configured to select either a signal for determining a data output timing of the write driver or a signal for determining a data read timing of the memory cell block according to the write training signal to obtain a selected signal, and generate the output control signal using the selected signal.

* * * * *